United States Patent
Zhang

(10) Patent No.: US 11,228,020 B2
(45) Date of Patent: Jan. 18, 2022

(54) DISPLAY BACK PLATE AND DISPLAY DEVICE

(71) Applicant: BOE TECHNOLOGY GROUP CO., LTD., Beijing (CN)

(72) Inventor: Yuxin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 64 days.

(21) Appl. No.: 16/494,585

(22) PCT Filed: Apr. 12, 2019

(86) PCT No.: PCT/CN2019/082359
§ 371 (c)(1),
(2) Date: Sep. 16, 2019

(87) PCT Pub. No.: WO2019/201160
PCT Pub. Date: Oct. 24, 2019

(65) Prior Publication Data
US 2020/0381657 A1 Dec. 3, 2020

(30) Foreign Application Priority Data
Apr. 20, 2018 (CN) .......................... 201810357717.X

(51) Int. Cl.
*H01L 51/52* (2006.01)
(52) U.S. Cl.
CPC .... *H01L 51/5253* (2013.01); *H01L 2251/301* (2013.01)
(58) Field of Classification Search
CPC ....................... H01L 51/5253; H01L 2251/301
See application file for complete search history.

(56) References Cited

U.S. PATENT DOCUMENTS 7,404,919 B2 * 7/2008 Yokoyama .......... B29C 33/3857
156/275.5
9,716,248 B2 * 7/2017 Visweswaran ...... H01L 51/0097
(Continued)

FOREIGN PATENT DOCUMENTS

| CN | 104425760 A | 3/2015 |
| CN | 105810710 A | 7/2016 |
| CN | 106601781 A | 4/2017 |
| CN | 106775173 A | 5/2017 |
| CN | 106816456 A | 6/2017 |

(Continued)

OTHER PUBLICATIONS

First Search Report on CN 201810357717.X, dated Apr. 18, 2019, 2 pages. English language version only.

(Continued)

*Primary Examiner* — Ida M Soward
(74) *Attorney, Agent, or Firm* — The Webb Law Firm

(57) ABSTRACT

The present disclosure relates to a display back plate and a display device. The display back plate includes a display area and a non-display area surrounding the display area, wherein the non-display area is provided with at least one circle of first cofferdam surrounding the display area, a first thin film encapsulation layer is arranged on the first cofferdam, and the non-display area is provided with a fan-out area, a second cofferdam is arranged on one side of the first cofferdam close to the fan-out area, the second cofferdam is provided with a first bonding pattern including a plurality of protrusions, and the first thin film encapsulation layer at least partially covers the protrusions.

13 Claims, 3 Drawing Sheets

(56) References Cited

U.S. PATENT DOCUMENTS

| | | | |
|---|---|---|---|
| 9,947,898 B2* | 4/2018 | Kim | H01L 51/5256 |
| 10,134,646 B2* | 11/2018 | Byun | H01L 51/56 |
| 10,170,534 B1* | 1/2019 | Kim | H01L 27/3258 |
| 10,185,174 B2* | 1/2019 | Kang | G02F 1/133528 |
| 10,381,420 B2* | 8/2019 | Liu | G06F 3/0412 |
| 10,698,241 B2* | 6/2020 | Min | C07F 11/00 |
| 10,743,425 B2* | 8/2020 | Park | H01L 51/5228 |
| 11,004,915 B2* | 5/2021 | Byun | H01L 27/3246 |
| 2008/0254560 A1* | 10/2008 | Yamazaki | H01L 27/1214 438/33 |
| 2012/0222797 A1* | 9/2012 | Kim | G02F 1/133526 156/109 |
| 2014/0078582 A1* | 3/2014 | Cho | G02B 1/118 359/485.03 |
| 2018/0130974 A1* | 5/2018 | Koo | H01L 51/5253 |
| 2019/0181379 A1* | 6/2019 | Chou | H01L 51/5246 |
| 2020/0044193 A1* | 2/2020 | Kim | H01L 51/5253 |

FOREIGN PATENT DOCUMENTS

| | | |
|---|---|---|
| CN | 106816551 A | 6/2017 |
| CN | 206282861 U | 6/2017 |
| CN | 107783691 A | 3/2018 |
| CN | 107808896 A | 3/2018 |
| CN | 107863376 A | 3/2018 |
| CN | 207116481 U | 3/2018 |
| CN | 107910450 A | 4/2018 |
| CN | 108565353 A | 9/2018 |

OTHER PUBLICATIONS

Office Action on CN 201810357717.X, dated Aug. 7, 2019, 12 pages with English language translation.
Office Action on CN 201810357717.X, dated May 7, 2019, 15 pages with English language translation.

\* cited by examiner

US 11,228,020 B2

DISPLAY BACK PLATE AND DISPLAY DEVICE

CROSS-REFERENCE TO RELATED APPLICATIONS

The present application is a U.S. National Stage under 35 U.S.C. § 371 of International Application No. PCT/CN2019/082359, as filed on Apr. 12, 2019, which claims priority to Chinese Patent Application No. 201810357717.X, as filed on Apr. 20, 2018. The contents disclosed in each of these applications are incorporated herein by reference in its entirety.

TECHNICAL FIELD

The present disclosure relates to a display back plate and a display device.

BACKGROUND

Flexible display devices, such as flexible OLED (Organic Light-Emitting Diode) and flexible QLED (Quantum Dot Light-Emitting Diodes), are the main trend of future development of display technology. Especially, the QLED has many advantages, such as impact resistance, strong shock resistance, light weight, small volume, portable and the like.

SUMMARY

An aspect of the present disclosure provides a display back plate, including a display area and a non-display area surrounding the display area, wherein the non-display area is provided with at least one circle of first cofferdam surrounding the display area, a first thin film encapsulation layer is arranged on the first cofferdam, and the non-display area is provided with a fan-out area, a second cofferdam is arranged on one side of the first cofferdam close to the fan-out area, the second cofferdam is provided with a first bonding pattern including a plurality of protrusions, and the first thin film encapsulation layer at least partially covers the protrusions.

In one or more embodiments of the present disclosure, the first bonding pattern includes first strip-shaped protrusions or first block-shaped protrusions.

In one or more embodiments of the present disclosure, at least a portion of the first cofferdam close to the fan-out area is provided with a second bonding pattern bonded to the first thin film encapsulation layer, and the second bonding pattern includes a plurality of protrusions.

In one or more embodiments of the present disclosure, the second bonding pattern includes second strip-shaped protrusions or second block-shaped protrusions.

In one or more embodiments of the present disclosure, the second cofferdam has a first area and a second area, the first thin film encapsulation layer covers the first area, the second area is not covered by the first thin film encapsulation layer, and the second thin film encapsulation layer covers the second area and at least partially covers an edge of the first thin film encapsulation layer located at the first area.

In one or more embodiments of the present disclosure, the non-display area is provided with two circles of the first cofferdam located at the inner side and the outer side at intervals, and the second cofferdam is provided outside the circle of the first cofferdam located at the outer side.

In one or more embodiments of the present disclosure, the non-display area is provided with two circles of the first cofferdam located at the inner side and the outer side at intervals, and a side of each circle of the first cofferdam facing the first thin film encapsulation layer has the second bonding pattern.

In one or more embodiments of the present disclosure, the first cofferdam and the second cofferdam are disposed at the same layer.

In one or more embodiments of the present disclosure, the second cofferdam is provided integrally with the first cofferdam located on the outer side.

In one or more embodiments of the present disclosure, the material forming the first cofferdam and the second cofferdam is a photosensitive resin, and the first bonding pattern and the second bonding pattern are formed by gray scale exposure.

In one or more embodiments of the present disclosure, the first and second bonding patterns include at least one of frustum-shaped protrusions, strip-shaped protrusions with an arc-shaped cross section, and strip-shaped protrusions with a trapezoidal cross section.

Another aspect of the present disclosure provides a display device including the above-described display back plate.

BRIEF DESCRIPTION OF THE DRAWINGS

Other features, objects and advantages of the present disclosure will become more apparent from the detailed description of non-limiting embodiments with reference to the following accompanying drawings.

DETAILED DESCRIPTION

Figure 1:
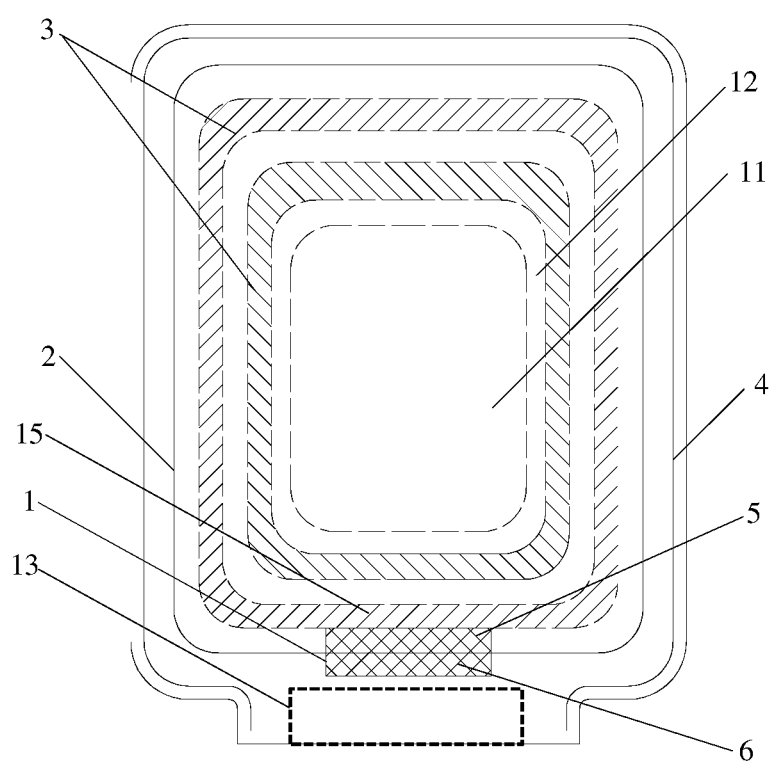
FIG. 1 is a schematic structural diagram of a display back plate according to an embodiment of the present disclosure.

The present disclosure will be further described in details below with reference to the accompanying drawings and embodiments. It is to be understood that the specific embodiments described herein are merely illustrative of the related content and are not limiting of the art. It should be noted that, for convenience of description, only the parts related to the present disclosure are shown in the drawings.

It is to be noted that, without conflictions, the embodiments and the features in the embodiments of the present disclosure can be combined mutually. The present disclosure will now be described in detail with reference to the accompanying drawings in conjunction with the embodiments.

The flexible OLED and the flexible QLED are generally encapsulated by a thin film. For example, the flexible OLED may be, but is not limited to, a structure including a flexible substrate, a barrier layer formed on the flexible substrate, a gate layer formed on the barrier layer, a gate insulating layer formed on the gate layer, an interlayer insulating layer formed on the gate insulating layer, and a passivation layer formed on the interlayer insulating layer. Further, a display layer is formed on the passivation layer in the display area, and a cofferdam is formed on the passivation layer in the non-display area. The display layer may include an anode layer, a light-emitting layer formed on the anode layer, and a cathode layer formed on the light-emitting layer. A first thin film encapsulation layer is formed on the display layer. Further, the first thin film encapsulation layer generally has two inorganic layers and an organic layer between the two inorganic layers, and the inorganic layers completely cover the organic layer to block water and oxygen. The organic layer is used to eliminate defects existing in the thin film encapsulation process and to coat particles generated in the thin film encapsulation process, and also to relieve stress on the inorganic layer.

As shown in FIG. 1, the display back plate provided by an embodiment of the present disclosure includes a display area 11 and a non-display area 12 surrounding the display area 11. The non-display area 12 is provided with at least one circle of first cofferdam 3 surrounding the display area 11, a first thin film encapsulation layer 2 is arranged on the first cofferdam 3, and the non-display area 12 is provided with a fan-out area 13. Further, a second cofferdam 1 is arranged on one side of the first cofferdam 3 close to the fan-out area 13. The second cofferdam 1 is provided with a first bonding pattern 14 comprising a plurality of protrusions 16, and at least part of the first thin film encapsulation layer 2 covers the protrusions 16. The display area 11 of the display back plate refers to an area where display is performed in the center of the display back plate, including an area where pixels are formed and an area between the pixels. The non-display area 12 of the display back plate refers to an area surrounding the display area 11 and having no pixels, including a wiring area, a test area, an encapsulation area, and the like.

In one or more embodiments of the present disclosure, the first bonding pattern 14 includes first strip-shaped protrusions or first block-shaped protrusions.

According to the above solution, the second cofferdam 1 is arranged in the fan-out area 13, the edge of the first thin film encapsulation layer 2 is bonded to a first area 5 of the second cofferdam 1 which is provided with a protruded first bonding pattern 14. Therefore, a contact area between the first thin film encapsulation layer 2 and the second cofferdam 1 is increased in the first area 5, and the adhesive force is improved, which thus avoids the problem of poor display caused by peeling between inorganic layers of the first thin film encapsulation layer 2 in the fan-out area 13 or between the inorganic layers of the first thin film encapsulation layer 2 and a passivation layer (substrate) in the bending process. In addition, since the edge of the first thin film encapsulation layer 2 is located in the middle of the second cofferdam 1, the contact area between the first thin film encapsulation layer 2 and the passivation layer is reduced, which further prevents the peeling between the inorganic layer and the passivation layer (substrate).

For example, the display back plate may be, but not limited to, a back plate of an OLED display device, which may include, but is not limited to, a structure including a flexible substrate, a barrier layer formed on the flexible substrate, a gate layer formed on the barrier layer, a gate insulating layer formed on the gate layer, an interlayer insulating layer formed on the gate insulating layer, and a passivation layer formed on the interlayer insulating layer. Further, a display layer is formed on the passivation layer in the display area 11, and a second cofferdam 1 and at least one circle of first cofferdam 3 are formed on the passivation layer in the non-display area 12. A first thin film encapsulation layer 2 is formed on the display layer. The second cofferdam 1 is at least located in the fan-out area 13, and the display layer may include an anode layer, a light emitting layer formed on the anode layer, and a cathode layer formed on the light emitting layer. The first cofferdam 3 and the second cofferdam 1 are both formed within the range of a cutting line 4, and a corresponding display back plate product is formed after cutting along the cutting line 4.

Figure 4:
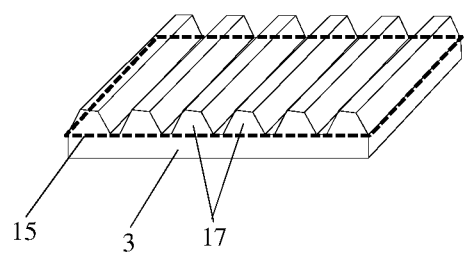
FIG. 4 is a schematic structural diagram of a first cofferdam.

In one or more embodiments of the present disclosure, in order to further improve the peeling resistance of the first thin film encapsulation layer, a second bonding pattern 15, to which the first thin film encapsulation layer 2 is bounded, is arranged at least a portion of the first cofferdam 3 close to the fan-out area 13. As shown in FIG. 4, the second bonding pattern 15 includes a plurality of protrusions 17. The second bonding pattern 15 may include the second strip-shaped protrusions or the second block-shaped protrusions. By disposing a second bonding pattern 15 that has protrusions 17 in a position of the first cofferdam 3 close to the fan-out area 13, a bonding area of the inorganic layers of first thin film encapsulation layer is further increased, the adhesive force is improved, and the possibility of peeling is reduced. In one or more embodiments of the present disclosure, the second bonding pattern 15 may be formed on the entire top surface of the first cofferdam 3 to maximize the bonding area between the inorganic layer and the first cofferdam 3.

Figure 2:
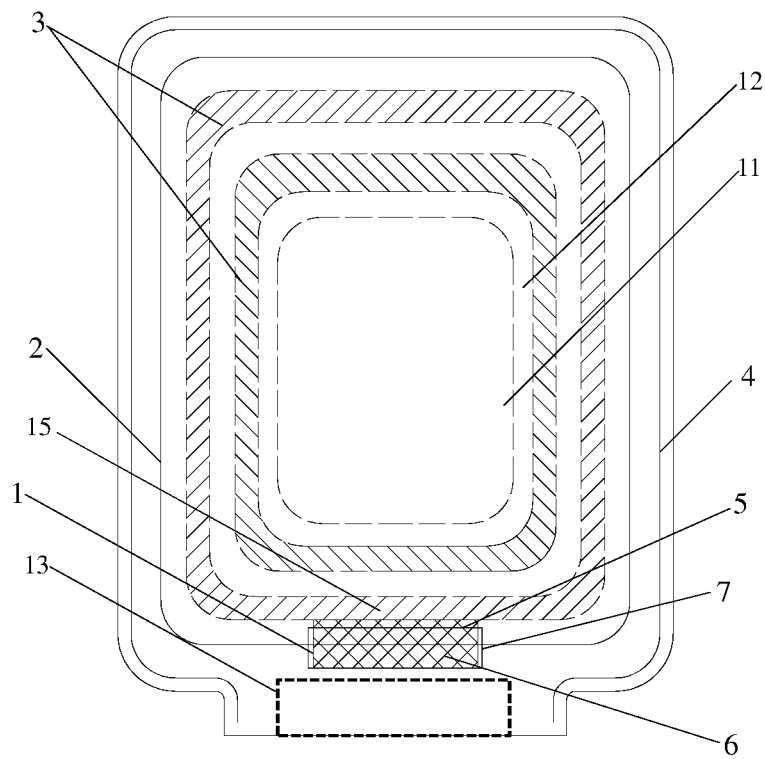
FIG. 2 is a schematic structural diagram of a display back plate according to an embodiment of the present disclosure.
Figure 3:
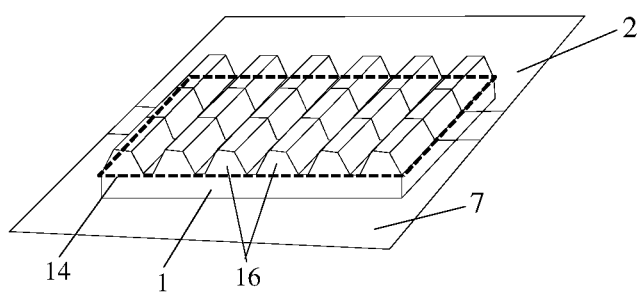
FIG. 3 is a schematic structural diagram of a second cofferdam when a second thin film encapsulation layer is formed.

In one or more embodiments of the present disclosure, referring to FIGS. 2 and 3, the second cofferdam 1 has a first area 5 and a second area 6, the first thin film encapsulation layer 2 covers the first area 5, the second area 6 is not covered by the first thin film encapsulation layer 2, and the second thin film encapsulation layer 7 covers the second area 6 and at least partially covers an edge of the first thin film encapsulation layer 2 located at the first area 5. By forming the second thin film encapsulation layer 7, the second thin film encapsulation layer 7 covers the second area 6 and is pressed against the first thin film encapsulation layer 2, thereby further improving the peeling resistance of the first thin film encapsulation layer 2 during bending.

In one or more embodiments of the present disclosure, two circles of the first cofferdam 3 are provided in the non-display area 12 at intervals, and the second cofferdam 1 is provided outside the circle of the first cofferdam 3 located at the outer side among the two circles of the first cofferdam 3. Providing two circles of the first cofferdam 3 can prevent the liquid forming the organic layer from overflowing during the thin film encapsulation. In one or more embodiments of the present disclosure, the height of the circle of the first cofferdam 3 located at the outer side may be higher than the height of the circle of the first cofferdam 3 located at the inner side.

In one or more embodiments of the present disclosure, the non-display area 12 is provided with two circles of the first cofferdam at intervals, and a second bonding pattern 15 is provided at a side of each circle of the first cofferdam facing the first thin film encapsulation layer. That is, the second bonding pattern 15 with a protruding structure is arranged at the top of the first cofferdam, so that on one hand, the adhesive force between the first thin film encapsulation layer and the first cofferdam can be improved, and on the other hand, the flexibility of the display back plate during bending can be improved.

In one or more embodiments of the present disclosure, in order to facilitate manufacturing and simplify the production process, the first cofferdam 3 and the second cofferdam 1 are disposed in the same layer. For example, they can be formed on the same passivation layer. The first cofferdam 3 and the second cofferdam 1 may be an integral structure or may be separate structures.

Figure 5:
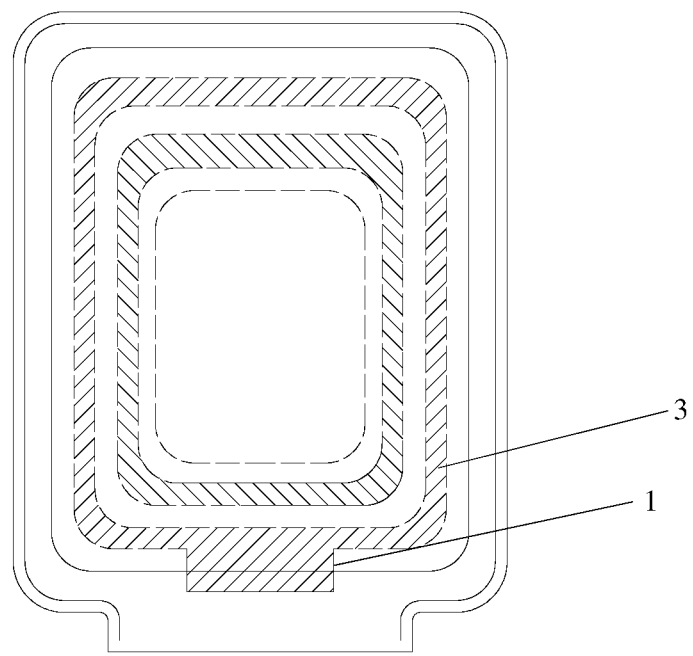
FIG. 5 is a schematic structural diagram of a display back plate according to an embodiment of the present disclosure.

In one or more embodiments of the present disclosure, referring to FIG. 5, in order to facilitate manufacturing and simplify the production process, the second cofferdam 1 and the first cofferdam 3 located on the outer side are integrally disposed, and the first cofferdam and the second cofferdam integrally connected thereto can be formed at one time through the same process.

In one or more embodiments of the present disclosure, the material forming the first cofferdam 3 and the second cofferdam 1 is a photosensitive resin, and the first bonding pattern 14 and the second bonding pattern 15 are formed by gray scale exposure.

Figure 6:
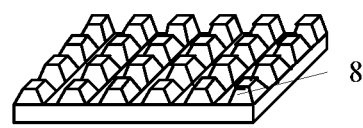
FIG. 6 is a schematic structural diagram in which a second cofferdam with the frustum-shaped protrusions is formed.
Figure 7:
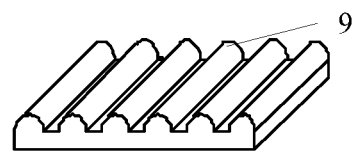
FIG. 7 is a schematic structural diagram in which a second cofferdam with strip-shaped protrusions having an arc-shaped cross section.
Figure 8:
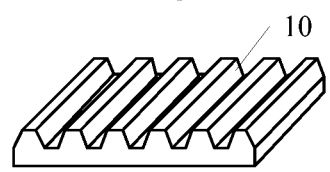
FIG. 8 is a schematic structural diagram in which a second cofferdam with strip-shaped protrusions having a trapezoidal cross section.

In one or more embodiments of the present disclosure, as shown in FIG. 6, FIG. 7, and FIG. 8, the first and second bonding patterns 14 and 15 include at least one of frustum-shaped protrusions 8, strip-shaped protrusions 9 with an arc-shaped cross section, and strip-shaped protrusions 10 with a trapezoidal cross section.

Another aspect of the present disclosure provides a display device including the above-described display back plate.

The above-described display device may be OLED or QLED.

The above descriptions are only preferred embodiments of the present disclosure and are illustrative of the principles of the technology employed. It should be understood by those skilled in the art that the scope of the present disclosure is not limited to the technical solutions formed by specific combinations of the above-described technical features, and should also encompass other technical solutions formed by any combination of the above-described technical features or the equivalent thereof without departing from the concept of the present invention. For example, the technical solutions formed by the above features be replaced with (but not limited to) features having similar functions disclosed in the present disclosure.

What is claimed is:

1. A display back plate, including a display area and a non-display area surrounding the display area, wherein the non-display area is provided with at least one circle of a first cofferdam surrounding the display area, a first thin film encapsulation layer is arranged on the first cofferdam, and the non-display area is provided with a fan-out area, a second cofferdam is arranged on one side of the first cofferdam close to the fan-out area, the second cofferdam is provided with a first bonding pattern including a plurality of protrusions, and the first thin film encapsulation layer at least partially covers the plurality of protrusions.

2. The display back plate of claim 1, wherein the first bonding pattern includes first strip-shaped protrusions or first block-shaped protrusions.

3. The display back plate of claim 1, wherein at least a portion of the first cofferdam close to the fan-out area is provided with a second bonding pattern bonded to the first thin film encapsulation layer, and the second bonding pattern includes a plurality of protrusions.

4. The display back plate of claim 3, wherein the second bonding pattern includes second strip-shaped protrusions or second block-shaped protrusions.

5. The display back plate of claim 1, wherein, the second cofferdam has a first area and a second area, the first thin film encapsulation layer covers the first area, the second area is not covered by the first thin film encapsulation layer, and a second thin film encapsulation layer covers the second area and at least partially covers an edge of the first thin film encapsulation layer located at the first area.

6. The display back plate of claim 1, wherein the non-display area is provided with two circles of the first cofferdam located at an inner side and an outer side at intervals, and the second cofferdam is provided outside a circle of the first cofferdam located at the outer side.

7. The display back plate of claim 3, wherein the non-display area is provided with two circles of the first cofferdam located at an inner side and an outer side at intervals, and a side of each circle of the first cofferdam facing the first thin film encapsulation layer has the second bonding pattern.

8. The display back plate of claim 1, wherein the first cofferdam and the second cofferdam are disposed in a same layer.

9. The display back plate of claim 6, wherein the second cofferdam and the circle of the first cofferdam located at the outer side are integrally arranged.

10. The display back plate of claim 1, wherein the first bonding pattern includes at least one of frustum-shaped protrusions, strip-shaped protrusions with an arc-shaped cross section, and strip-shaped protrusions with a trapezoidal cross section.

11. The display back plate of claim 3, wherein the second bonding pattern includes at least one of frustum-shaped protrusions, strip-shaped protrusions with an arc-shaped cross section, and strip-shaped protrusions with a trapezoidal cross section.

12. The display back plate of claim 1, wherein a material of the first cofferdam and the second cofferdam is a photosensitive resin.

13. A display device, including a display back plate, including a display area and a non-display area surrounding the display area, wherein the non-display area is provided with at least one circle of a first cofferdam surrounding the display area, a first thin film encapsulation layer is arranged on the first cofferdam, and the non-display area is provided with a fan-out area, a second cofferdam is arranged on one side of the first cofferdam close to the fan-out area, the second cofferdam is provided with a first bonding pattern including a plurality of protrusions, and the first thin film encapsulation layer at least partially covers the plurality of protrusions.

* * * * *